(12) United States Patent
Thinakaran

(10) Patent No.: US 11,038,517 B1
(45) Date of Patent: Jun. 15, 2021

(54) MULTIPLYING DIGITAL-TO-ANALOG CONVERTER (MDAC) WITH NONLINEAR CALIBRATION

(71) Applicant: Texas Instruments Incorporated, Dallas, TX (US)

(72) Inventor: Rajavelu Thinakaran, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/744,614

(22) Filed: Jan. 16, 2020

Related U.S. Application Data

(60) Provisional application No. 62/955,613, filed on Dec. 31, 2019.

(51) Int. Cl.
| | | |
|---|---|---|
| *H03M 1/10* | (2006.01) | |
| *H03M 1/08* | (2006.01) | |
| *H03M 1/00* | (2006.01) | |
| *H03M 1/66* | (2006.01) | |
| *H03M 1/06* | (2006.01) | |

(52) U.S. Cl.
CPC ............ *H03M 1/1033* (2013.01); *H03M 1/00* (2013.01); *H03M 1/001* (2013.01); *H03M 1/06* (2013.01); *H03M 1/089* (2013.01); *H03M 1/10* (2013.01); *H03M 1/66* (2013.01)

(58) Field of Classification Search
CPC .......... H03M 1/10; H03M 1/001; H03M 1/66; H03M 1/00; H03M 1/06; H03M 1/089
USPC .................. 341/120, 110, 144, 145, 118, 119
See application file for complete search history.

(56) References Cited

U.S. PATENT DOCUMENTS

2013/0293401 A1* 11/2013 Werking ............... H03M 3/388
341/120

\* cited by examiner

*Primary Examiner* — Joseph J Lauture
(74) *Attorney, Agent, or Firm* — John R. Pessetto; Charles A. Brill; Frank D. Cimino

(57) ABSTRACT

A system includes a multiplying digital-to-analog converter (MDAC). The system also includes an input-side component coupled to the MDAC and configured to provide a code to the MDAC. The system also includes a reference voltage source coupled to the MDAC and configured to provide a reference voltage to the MDAC. The MDAC comprises a nonlinear calibration circuit configured to adjust an output of the MDAC nonlinearly based on the code, the reference voltage, and an output of the nonlinear calibration circuit.

20 Claims, 5 Drawing Sheets

MULTIPLYING DIGITAL-TO-ANALOG CONVERTER (MDAC) WITH NONLINEAR CALIBRATION

CROSS-REFERENCE TO RELATED APPLICATION

This application claims priority to U.S. Provisional Application No. 62/955,613, filed Dec. 31, 2019, which is hereby incorporated by reference.

BACKGROUND

The proliferation of consumer electronic devices and integrated circuit (IC) technology has resulted in the commercialization of IC products. As new consumer electronic devices are developed and IC technology advances, new IC products are commercialized. One example IC product that is needed in consumer electronic devices is a digital-to-analog converter (DAC). There are many types of DACs with variations in architecture and resolution. On type of DAC is referred to as a multiplying DAC (MDAC), where the output of the MDAC is a function of a reference voltage and a code. One of the issues limiting DAC resolution or accuracy, including the accuracy of MDACs, is temperature induced error in the DAC output. Efforts to improve the DAC performance, including DAC resolution, are ongoing.

SUMMARY

In accordance with at least one example of the disclosure, a system comprises a multiplying digital-to-analog converter (MDAC). The system also comprises an input-side component coupled to the MDAC and configured to provide a code to the MDAC. The system also comprises a reference voltage source coupled to the MDAC and configured to provide a reference voltage to the MDAC. The MDAC comprises a nonlinear calibration circuit configured to adjust an output of the MDAC nonlinearly based on the code, the reference voltage, and an output of the nonlinear calibration circuit.

In accordance with at least one example of the disclosure, an MDAC comprises a resistor ladder circuit with switches controlled by a code. The MDAC also comprises a nonlinear calibration circuit. The nonlinear calibration circuit comprises a calibration resistor with a first end coupled to an output of the resistor ladder circuit and with a second end coupled to an operational amplifier input node. The nonlinear calibration circuit also comprises a calibration current source configured to apply a calibration current at the operational amplifier input node.

In accordance with at least one example of the disclosure, a method receiving, by a multiplying digital-to-analog converter (MDAC), a reference voltage and a multi-bit code. The method also comprises providing a calibration current based on the multi-bit code and self-heating correction parameters of the MDAC. The method also comprises adjusting an output current of the MDAC nonlinearly based on the calibration current.

BRIEF DESCRIPTION OF THE DRAWINGS

For a detailed description of various examples, reference will now be made to the accompanying drawings in which.

DETAILED DESCRIPTION

Disclosed herein are multiplying digital-to-analog converter (MDAC) topologies with a nonlinear calibration circuit along with related systems, devices, and methods. In the proposed MDAC topologies, the MDAC is configured to provide an output voltage based on a multi-bit code (referred to as a "code" herein) and a reference voltage. In addition, the nonlinear calibration circuit is configured to correct for self-heating of an MDAC, where the self-heating is a function of the code provided to the MDAC.

In an example topology, an MDAC device (e.g., an integrated circuit (IC), or multi-die module (MDM), having an MDAC and possibly other components) includes a resistor ladder circuit with switches controlled by a code. The MDAC device also includes a nonlinear calibration circuit, where the nonlinear calibration circuit includes a calibration resistor with a first end coupled to an output of the resistor ladder circuit and with a second end coupled to an output node. In some examples, the output node is coupled to one of the inputs of an operational amplifier included with or coupled to the MDAC device.

The nonlinear calibration circuit also includes a calibration current source configured to apply a calibration current at the output node. In some examples, the calibration current source includes a pre-scaling circuit and a digital-to-analog converter (DAC) coupled to the pre-scaling circuit, where the pre-scaling circuit scales the reference voltage based at least in part on a self-heating curvature correction value. Also, the DAC is configured to output the calibration current based on the scaled reference voltage, the code, and a self-heating curvature correction sign value. When applied to the output node, the calibration current corrects an MDAC output for nonlinear self-heating error, and thus increases accuracy of the MDAC. In some examples, the output node is coupled to an operational amplifier included with or separate from the other components of an MDAC device (e.g., an IC, MDM, or other MDAC device). With the operational amplifier, the output current from a resistor ladder circuit of an MDAC is converted to an output voltage. In some examples, a negative feedback loop with a feedback resistor is used with the operational amplifier. In such examples, the value of the calibration resistor is less than the feedback resistor to minimize noise. To provide a better understanding, various MDAC options, and related devices, systems, and methods are described using the figures as follows.

Figure 1:
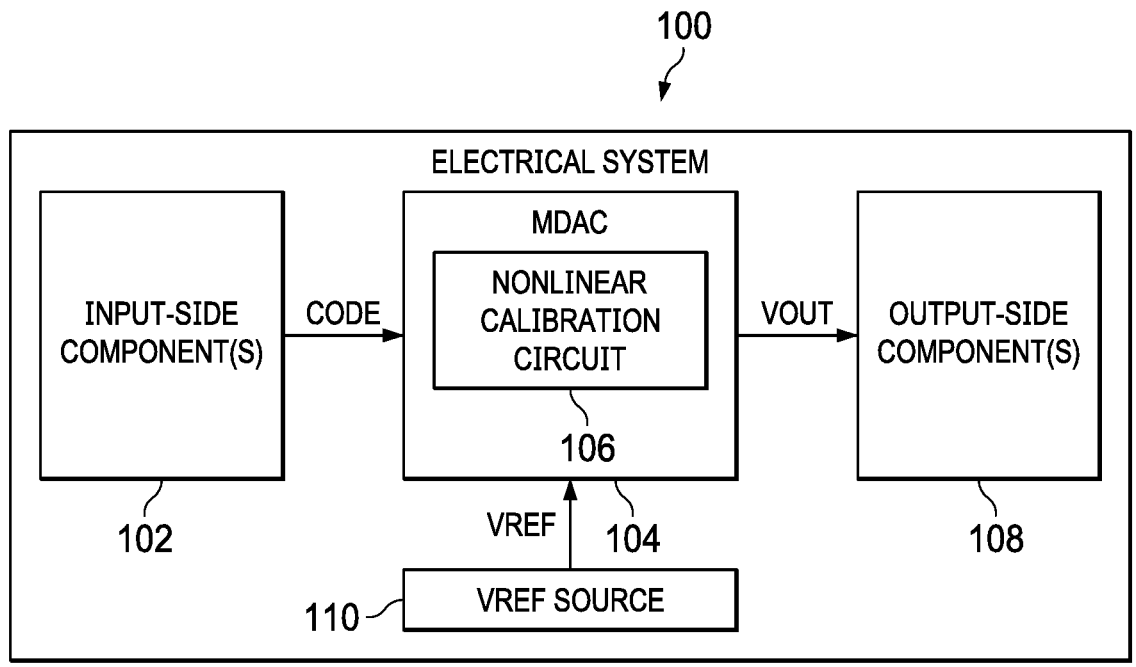
FIG. 1 is a block diagram showing an electrical system in accordance with some examples.

FIG. 1 is a block diagram showing an electrical system 100 in accordance with some examples. As shown, the electrical system 100 includes an MDAC 104 with a nonlinear calibration circuit 106. The MDAC 104 is coupled to and receives a code from input-side component(s) 102. Example input-side component(s) 102 include a microprocessor, an analog-to-digital converter (ADC), a central processor unit (CPU), and/or other components. The MDAC 104 also receives a reference voltage (VREF) from a VREF source (not shown), where the output voltage (VOUT) of the MDAC 104 is a function of VREF and the code.

One of the issues affecting accuracy of the MDAC 104 is self-heating error, which affects VOUT nonlinearly as a function of the code. This is because as current flows through a resistor, power is dissipated (power=V*I, where V is the voltage across a resistor, and I is the current in the resistor), resulting in heat generation, changes in resistivity, and nonlinear VOUT error. To account for such nonlinearity, the MDAC 104 includes a nonlinear calibration circuit 106, which is configured to provide a nonlinear correction to VOUT that accounts for self-heating error. The output of the MDAC 104 is provided to output-side component(s) 108. One example of the output-side component(s) 108 is an operational amplifier included with or separate from the MDAC 104 on an IC, MDM, or other MDAC device. With the operational amplifier, an output current of the MDAC 104 is converted into an output voltage.

Figure 2:
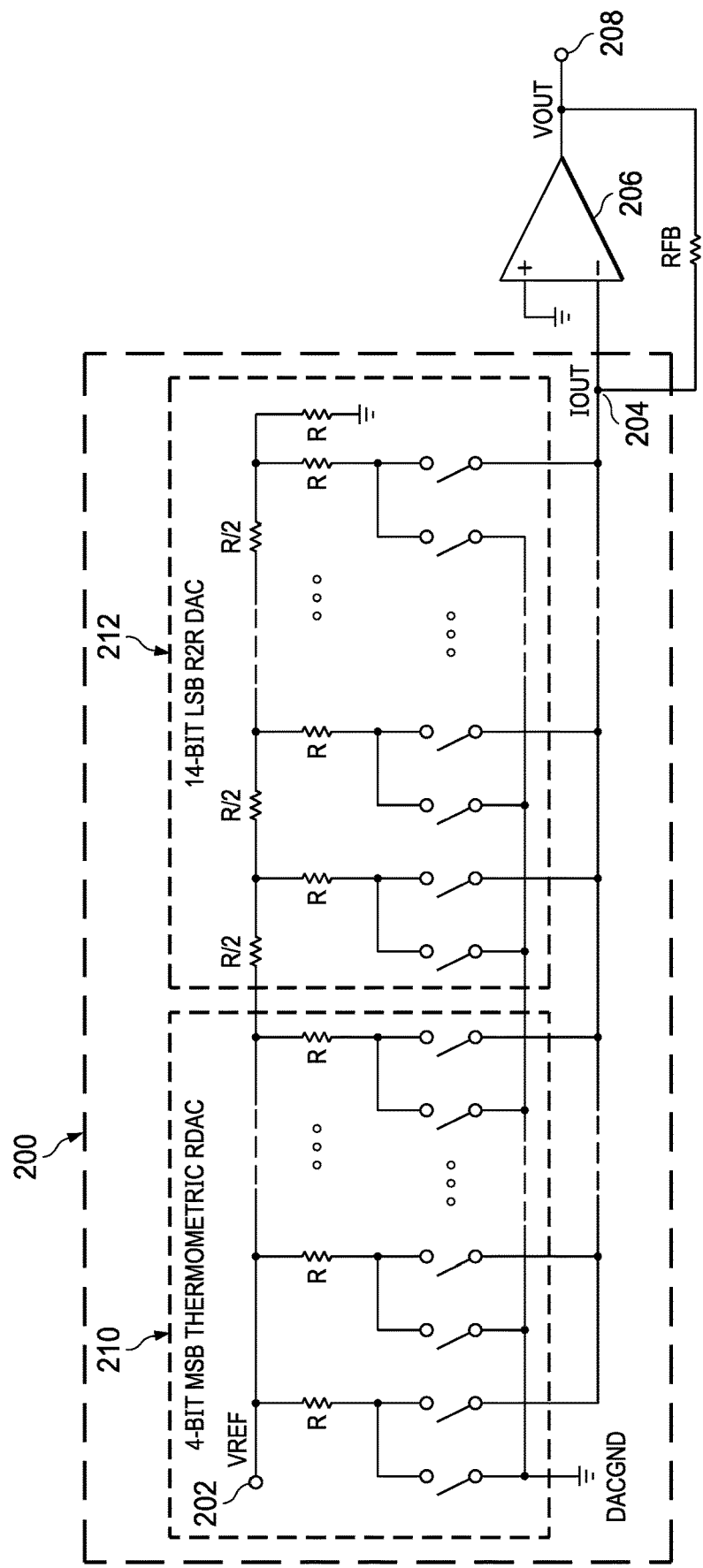
FIG. 2 is a schematic diagram showing a multiplying digital-to-analog converter (MDAC) and an operational amplifier in accordance with some examples.

FIG. 2 is a schematic diagram showing an MDAC 200 and an operational amplifier 206 in accordance with some examples. In the example of FIG. 2, the MDAC 200 includes a VREF node 202 configured to receive VREF. The MDAC 200 also includes a resistor ladder circuit corresponding to a first resistor ladder portion 210, such as a 4-bit most-significant bit (MSB) thermometric resistive digital-to-analog converter (RDAC). The resistor ladder circuit of the MDAC 200 also includes a second resistor ladder portion 212, such as a 14-bit least-significant bit (LSB) R2R DAC. In FIG. 2, the first and second resistor ladder portions 210 and 212 include switches to selectively couple the R resistors to a ground node (DACGND) or an output node 204 of the MDAC 200. The output node 204 provides an output current of the MDAC 200.

In the example of FIG. 2, a negative input of the operational amplifier 206 is coupled to the output node 204 of the MDAC 200, while a positive input of the operational amplifier 206 is coupled to a ground node. Also, a feedback path with a feedback resistor (RFB) is used between the output and the negative input of the operational amplifier 206. With the operational amplifier 206, IOUT of the MDAC 200 is converted to an output voltage (VOUT), where the accuracy of VOUT is negatively affected by self-heating of the feedback resistor (RFB) due to IOUT flowing through RFB. In the example of FIG. 2, a nonlinear calibration circuit is omitted, and thus VOUT does not include nonlinear corrections to account for self-heating errors as described herein.

Self-heating causes the resistance value of the resistors of the MDAC 200 to change depending on the voltage across the resistor. The change in resistance due to self-heating be computed as follows:

$$\Delta T = a_0 \times J = a_0 \times \frac{V}{(R \times W)},$$

where a0 is a self-heating coefficient, V is the voltage across a resistor, and W is the resistor width. Also, $$\frac{\Delta R}{R} = \Delta T \times TC1 = a_0 \times TC1 \times \frac{V}{(R \times W)},$$

where TC1 is the temperature coefficient. Also $$R = Ro \times \left(1 + \frac{\Delta R}{R}\right) = Ro \times \left(1 + a_0 \times TC1 \times \frac{V}{(R \times W)}\right).$$

Thus, $R = Ro \times (1 + c_0 \times V)$, where $c_0$ is $a_0 * TC1/(R*W)$.

With self-heating in RFB, second order nonlinearity results. More specifically, the current (IFB) through the feedback resistor is $$IFB = \frac{VREF \times code}{R}$$

[code=0, 1, . . . , $2^M - 1$; M number of thermometric bits]. Also, $$VOUT = -\left(\frac{VREF \times code}{R}\right) \times RFB$$

[where $R = R_{FB} * 2^M$]. Due to self-heating, RFB changes with VOUT. Hence, $$VOUT = -\left(\frac{VREF \times code}{R}\right) \times RFB \times (1 + co \times |VOUT|).$$

Also, $$VOUT = -\left(\frac{VREF \times code}{R}\right) \times RFB \times \left(1 + co \times \left(\frac{VREF \times code}{R}\right) \times RFB\right).$$

Also, $$-\frac{VOUT}{VREF} = a_1 \times code + a_2 \times code^2,$$

where $$a1 = \frac{1}{2^M} \text{ and}$$

$$a2 = \frac{1}{2^{2M}} \times \left(\frac{VREF}{RFB}\right) \times a_o \times TC1 \times \left(\frac{1}{W}\right).$$

In different scenarios, self-heating results in INL of several LSBs.

Figure 3:
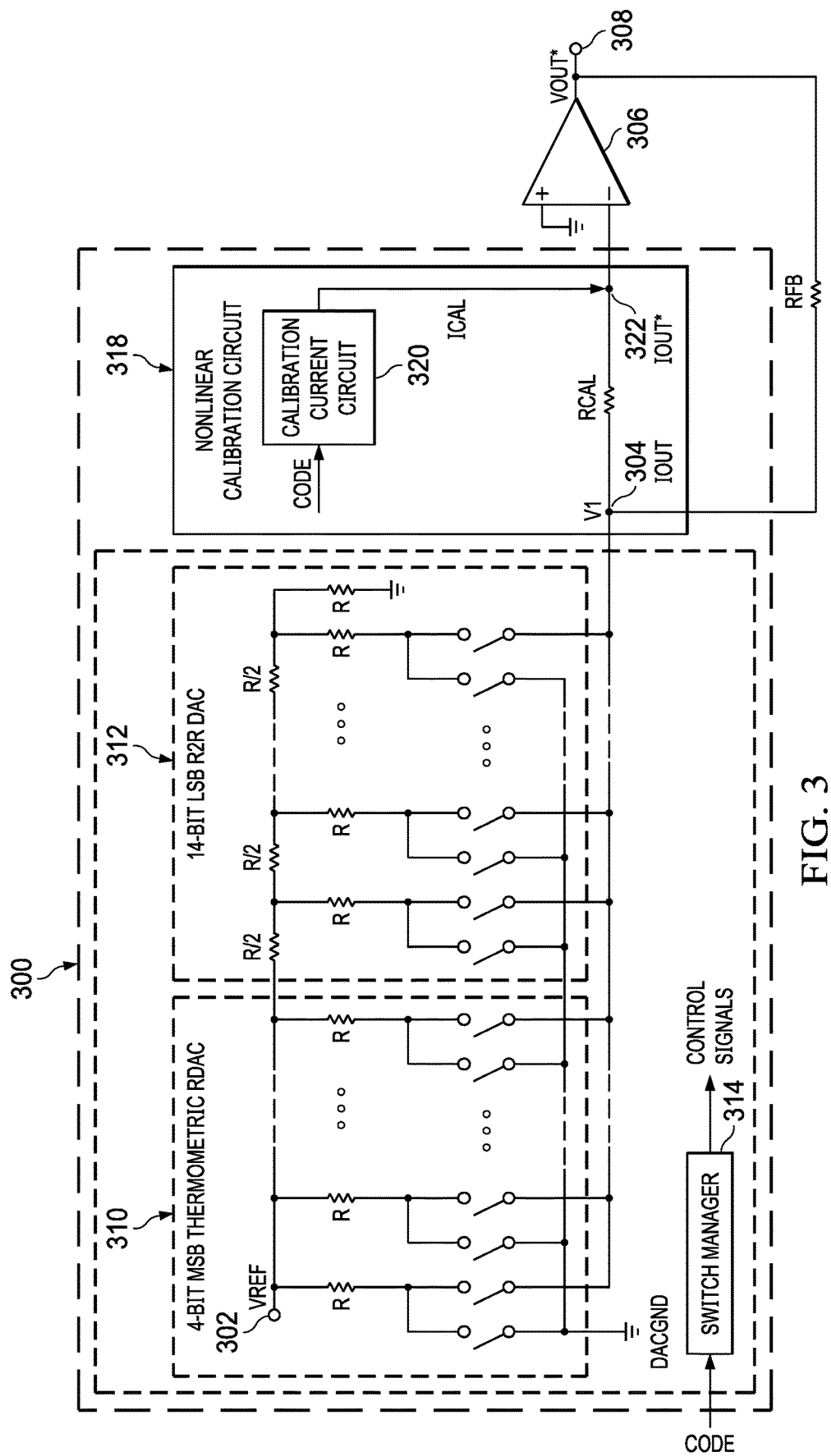
FIG. 3 is a diagram showing an MDAC with an operational amplifier and a nonlinear calibration circuit in accordance with some examples.

FIG. 3 is a diagram showing an MDAC 300 with a nonlinear calibration circuit 318 in accordance with some examples. In the example of FIG. 3, the MDAC 300 includes a VREF node 302 configured to receive VREF. The MDAC 300 also includes a resistor ladder circuit corresponding to a first resistor ladder portion 310, such as a 4-bit MSB thermometric RDAC. The resistor ladder circuit of the MDAC 300 also includes a second resistor ladder portion 312, such as a 14-bit LSB R2R DAC. In FIG. 3, the first and second resistor ladder portions 310 and 312 include switches to selectively couple the R resistors to a ground node (DACGND) or an output node 304 of the MDAC 300. These switches are controlled by a switch manager 314, which provides control signals for the switches based a code received by the MDAC 300. The output node 304 provides an output current (IOUT) of the MDAC 300 based on VREF and the code.

In the example of FIG. 3, a linear IOUT (a function of the code) flows through feedback resistor RFB results in self-heating of RFB and non-linearity in VOUT. To correct for such error, a nonlinear calibration circuit 318 is used, where the nonlinear calibration circuit 318 is coupled to or includes the output node 304 of the MDAC 300. In some examples, the nonlinear calibration circuit 318 is configured to apply a $2^{nd}$ order nonlinearity correction to cancel self-heating non-linearity of the MDAC 300.

In the example of FIG. 3, the nonlinear calibration circuit 318 includes a calibration resistor (RCAL) with a first end coupled to the output node 304. The nonlinear calibration circuit 318 also includes a calibration current circuit 320 coupled to a calibration node 322 at the second end of RCAL. The calibration current circuit 320 is configured to apply a calibration current (ICAL) to the calibration node 322, where ICAL is based on the code for the MDAC 300 (the code received by the switch manager 314) and self-heating correction parameters of the MDAC 300 determined by previous testing or other means.

In the example of FIG. 3, voltage V1 is a function of ICAL (V1=−ICAL*RCAL). This adjusts the output current (IOUT), where the adjusted output current (IOUT*) at the output node 304 of the MDAC 300 is a function of the first and second resistor ladder portions 310 and 312 and ICAL. Note: the current entering the negative (−ve) input of the operational amplifier 306 is zero, so the current through RCAL is ICAL. Also, the negative feedback ensures that the negative input of the operational amplifier 306 is at same voltage as the positive (+ve) input which is zero. This means that V1=−ICAL*RCAL.

The operational amplifier 306 converts IOUT* to an output voltage (VOUT*) that includes a correction applied by the nonlinear calibration circuit 318. As shown, a negative input of an operational amplifier 306 is coupled to the calibration node 322, while a positive input of the operational amplifier 306 is coupled to a ground node. Also, a feedback path with RFB is used between the output and the negative input of the operational amplifier 306. With the MDAC 300 (including the nonlinear calibration circuit 318) and the operational amplifier 306 of FIG. 3, the output (VOUT*) of the operational amplifier 306 corresponds to the output of the MDAC 300, where the accuracy of VOUT* of FIG. 3 is improved relative to the accuracy of VOUT in FIG. 2. This is because the nonlinear calibration circuit 318 corrects for self-heating error of the RFB, which is due to code dependent current (IOUT) flowing through RFB.

In the proposed MDAC 300 of FIG. 3, the calibration current circuit 320 pumps ICAL into RCAL, where $$ICAL = -\left(\frac{VREF}{RCALDAC}\right) \times code,$$

and where RCALDAC is the resistance of a DAC of the calibration current circuit 320. This arrangement results in the voltage (V1) at the output node 304 decreasing proportional to the code as follows:

$$V1 = -\left(\frac{VREF \times RCAL}{RCALDAC}\right) \times code = -b1 \times code \times VREF.$$

With V1 varying with code, there is a second order nonlinearity in VOUT. This nonlinearity can be made equal and opposite to the nonlinearity caused by self-heating, thereby correcting the second order nonlinearity due to self-heating.

In other examples, second order nonlinearity due to self-heating is corrected using a variable resistor and a fixed current source. In these examples, RCAL would be a variable resistor that varies as a function of the code and self-heating correction parameters. Also the calibration current circuit 320 would be a fixed current source.

Figure 4:
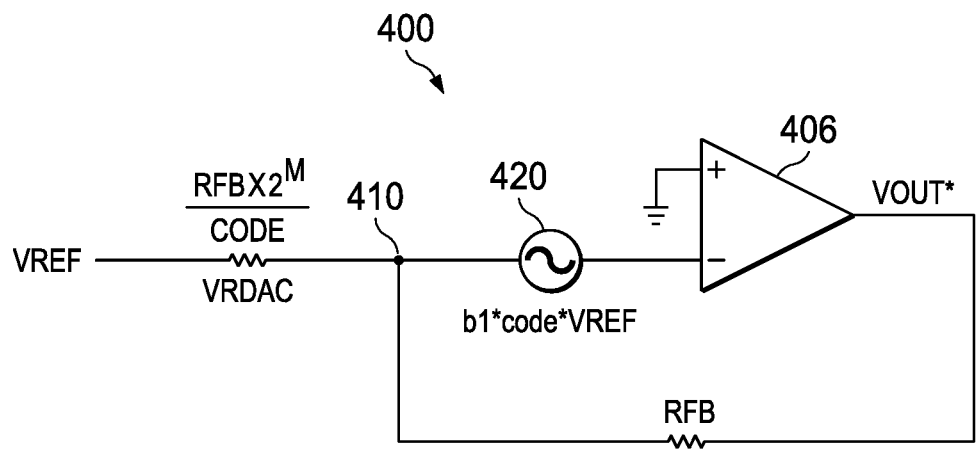
FIG. 4 is a simplified diagram showing an MDAC with an operational amplifier and a nonlinear calibration circuit in accordance with some examples.

FIG. 4 is a simplified diagram showing an MDAC 400 with nonlinear calibration in accordance with some examples. As shown, the MDAC 400 includes a variable DAC resistor (VRDAC) that receives VREF, where the variance of VRDAC is based on $$\frac{RFB \times 2^M}{code},$$

where RFB is the value of RFB in the feedback loop of the operational amplifier 406, M is the number of thermometric bits, and code is the input code for an MDAC. The node 410 in FIG. 4 corresponds to the output node of an MDAC. As shown, the MDAC 400 also includes a variable voltage source 420 coupled between the node 410 and the operational amplifier 406, where the variable voltage source 420 applies a voltage equal to b1*code*VREF, where b1 is a scaling factor. In some examples, b1 is a function of self-heating correction parameters as described herein. As shown, a feedback loop with RFB is between the output of the operational amplifier 406 and the node 410. With the arrangement of FIG. 4, the output voltage (VOUT*) of the operational amplifier 406 is calibrated based on the variable voltage source 420. In one example, the variable voltage source 420 provides a nonlinear calibration and is a function of ICAL*RCAL as described in FIG. 3. In another example, the variable voltage source 420 is accomplished using a variable resistor and a fixed current.

The MDAC 400 shows the introduction of $2^{nd}$ order nonlinearity in VOUT. More specifically, $$\left(\frac{VREF - V1}{RFB \times 2^M}\right) \times code = \left(\frac{V1 - VOUT}{RFB}\right).$$

Also, V1=−b1×VREF×code. By solving these equations, $$-\left(\frac{VOUT}{VREF}\right) = \left(\frac{1}{2^M} + b1\right)code + \frac{b1}{2^M}code^2.$$

Thus, in some examples, a $2^{nd}$ order nonlinearity is used to cancel the nonlinearity introduced by self-heating.

Figure 5:
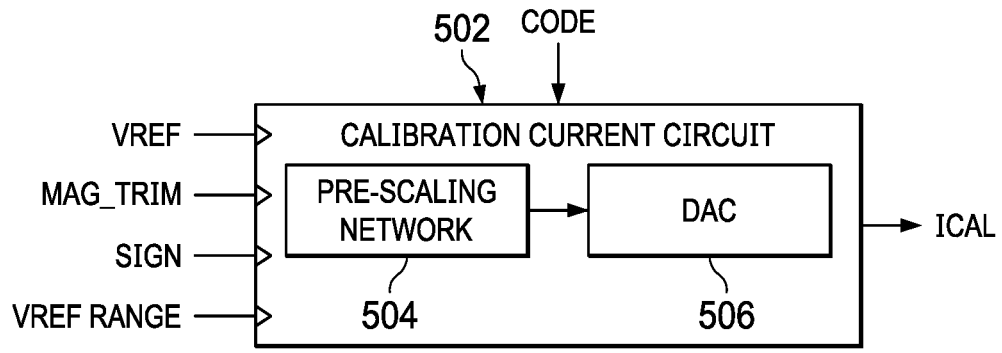
FIG. 5 is a block diagram showing a calibration current circuit for nonlinear MDAC calibration in accordance with some examples.

FIG. 5 is a block diagram showing a calibration current circuit 502 (an example of the calibration current circuit 320 in FIG. 3) for nonlinear MDAC calibration in accordance with some examples. As shown, the calibration current circuit 502 includes a pre-scaling network 504 coupled to a DAC 506. In the example of FIG. 5, the inputs to the calibration current circuit 502 include an input code (e.g., the code input to the MDAC 300), VREF (e.g., VREF input to the MDAC 300), a self-heating curvature correction magnitude value (MAG_TRIM), a self-heating curvature correction sign value (SIGN), and a VREF range value (e.g., to indicate different REF range options such as 8V-10V, 12-15V, and so on). In some examples, MAG_TRIM and SIGN are determined by testing a related MDAC to determine self-heating correction parameters.

In some examples, the pre-scaling network is configured to scale VREF based at least in part on MAG_TRIM and the VREF range value. Also, the DAC 506 is configured to generate ICAL based on the scaled version VREF (output from the pre-scaling network 504), the code, and the value of SIGN. Depending on temperature coefficient polarity, the $2^{nd}$ order nonlinearity due to self-heating can have positive or negative curvature. To be able to cancel both polarities, the calibration current circuit uses the value of SIGN. Also, in some examples, the magnitude of self-heating curvature correction is to be trimmed for every device. This magnitude is MAG_TRIM. Since the $2^{nd}$ order nonlinearity coefficient due to self-heating is proportional to VREF, a programmable register value (e.g., a static value) is used to specify the VREF range. In some examples, the VREF range is used to scale ICAL.

Figure 6:
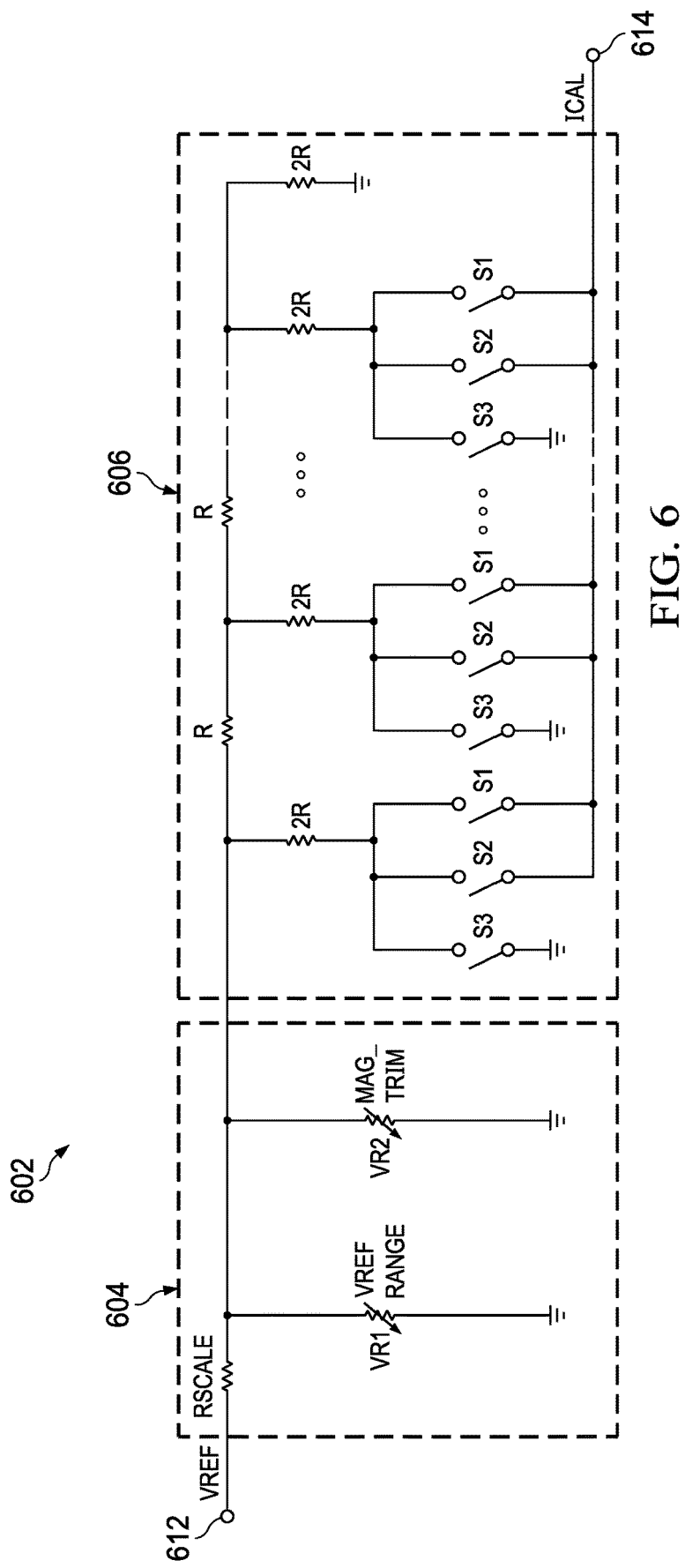
FIG. 6 is a schematic diagram showing a calibration current circuit for nonlinear MDAC calibration in accordance with some examples.

FIG. 6 is a schematic diagram showing a calibration current circuit 602 (an example of the calibration current circuit 320 in FIG. 3, or the calibration current circuit 502 in FIG. 5) for nonlinear MDAC calibration in accordance with some examples. In the example of FIG. 6, the calibration current circuit 602 includes a pre-scaling network 604 (an example of the pre-scaling network 504 in FIG. 5) and a DAC 606. As shown, the pre-scaling network 604 includes a scaling resistor (RSCALE) with a first end coupled to a VREF node 612. The second end of RSCALE is coupled to a first variable resistor (VR1) whose value varies as a function a VREF range value. The second end of RSCALE is also coupled to a second variable resistor (VR2) whose value varies as a function a MAG_TRIM. As shown, VR1 and VR2 are coupled between the second end of RSCALE and a ground node. With RSCALE, VR1 and VR2, VREF is scaled to account for the VREF range and MAG_TRIM.

The output of the pre-scaling network 504 is provided to the DAC 606, which comprises a network of R and 2R resistors. In operation, different combinations of R and 2R resistors are selectively coupled to ground or to an output node 614 of the DAC 606 by controlling switch groups (S1, S2, S3). In one example, SIGN=0 is used to correct positive self-heating error curvature. When SIGN=0, S1 and S3 switches are closed depending on the code value, and S2 switches are open. SIGN=1 is to correct negative self-heating error curvature. When SIGN=1, S2 and S3 switches are closed depending on code value, and S1 switches are open. When ICAL is combined with IOUT from an MDAC as described herein, an adjusted MDAC IOUT (e.g., IOUT* at output node 304) accounts for a nonlinear correction (e.g., to account for self-heating error of an MDAC).

Figure 7:
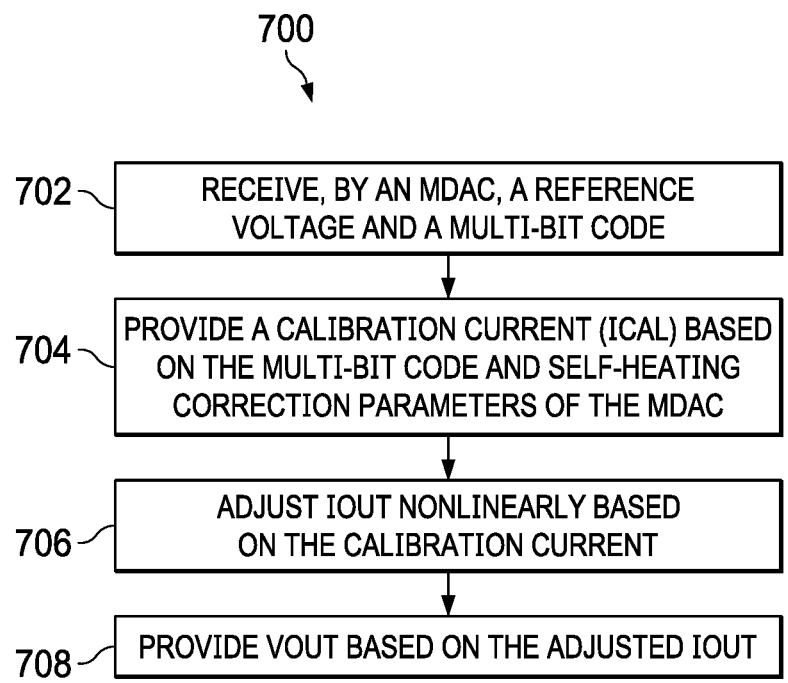
FIG. 7 is a flow chart showing an MDAC method involving nonlinear calibration in accordance with some examples.

FIG. 7 is a flow chart showing an MDAC method 700 involving nonlinear calibration in accordance with some examples. In the example of FIG. 7, the method 700 includes receiving, by an MDAC, VREF and a multi-bit code at block 702. At block 704, a calibration current (ICAL) is provided based on the multi-bit code and self-heating correction parameters. At block 706, the IOUT of the MDAC related to the method 700 is adjusted based on the calibration current (e.g., resulting in IOUT* as in FIG. 3). At block 708, an output voltage (VOUT) is provided based on the adjusted IOUT.

In some examples, providing the calibration current at block 704 involves receiving, by a calibration current circuit, the self-heating correction parameters, wherein the self-heating correction parameters comprise a self-heating curvature correction magnitude value and a self-heating curvature correction sign value. In some examples, the method 700 also includes testing the MDAC to determine the self-heating curvature correction magnitude value and the self-heating curvature correction sign value. In some examples, providing the calibration current at block 704 involves: scaling a reference voltage based on a scaling resistor, the self-heating curvature correction magnitude value, and a voltage reference range value; and converting the scaled reference voltage to the calibration current based on the multi-bit code and the self-heating curvature correction sign value. In other examples, providing the calibration current based on the multi-bit code and self-heating correction parameters of the MDAC involves a variable resistor and a fixed current source. In some examples, the method 700 also includes providing, by an operational amplifier, an output voltage based on the adjusted output current.

Without the nonlinear calibration circuit proposed herein, the width of RFB could be increased until the INL due to self-heating complies with a target. In one example, the result would be w=148.4 um for 2 kohm resistor (area=0.045 square mm). To meet an INL budget of ~0.2 LSB due to self-heating, RFB width has to be increased to ~2400 um, which is not practical. Another option is to employ a digital solution to implement second order curvature algorithm. This would involve a multiplier and other digital hardware, which are area and switching power intensive. In contrast, the proposed solution to provide nonlinear calibration is accomplished without digital hardware and with minimal analog circuitry. The only additional analog circuitry is RCAL (e.g., ~100 ohm). With the proposed solution, the code for an MDAC is used to generate a current that cancels self-heating error by canceling in an equal and opposite second order curvature in analog.

With the proposed solution, increase in MDAC resolution is possible (e.g., 18 bit linearity specifications) without the addition of area and computation intensive digital hardware. There is a demand to increase the MDAC update rate as much as possible to take advantage of the fast settling property of MDACs. Eliminating the digital hardware for second order nonlinearity correction help in this direction by reducing digital latency. Also, the proposed solution reduces the design cycle time by eliminating the digital hardware needed for second order nonlinearity correction. Also, the proposed solution, minimizes digital switching, thus minimizing the digital feedthrough and switching current.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system, comprising:
a multiplying digital-to-analog converter (MDAC) having a code input, an reference voltage input and a output;
an input-side component having a code output coupled to the code input wherein the input-side component is configured to provide a code to the MDAC; and
a reference voltage source having an input coupled to the output of the MDAC wherein the reference voltage source is configured to provide a reference voltage to the reference voltage input of the MDAC,
wherein the MDAC comprises a nonlinear calibration circuit configured to adjust the output of the MDAC nonlinearly based on the code, the reference voltage, and an output of the nonlinear calibration circuit.

2. The system of claim 1, wherein the output of the nonlinear calibration circuit is a function of the code.

3. The system of claim 1, wherein the MDAC comprises a resistor ladder circuit, wherein the system further comprises an operational amplifier, and wherein the nonlinear calibration circuit comprises:
a calibration resistor with a first terminal coupled to an output of the resistor ladder circuit and with a second terminal coupled to a negative input of the operational amplifier; and
a calibration current source configured to apply a calibration current at the negative input of the operational amplifier.

4. The system of claim 3, wherein the calibration current source comprises:
a pre-scaling circuit having an output; and
a digital-to-analog converter (DAC) having an input coupled to the output of the pre-scaling circuit.

5. The system of claim 4, wherein the pre-scaling circuit comprises:
a scaling resistor having a first terminal and a second terminal;
a first variable resistor having a first terminal and a second terminal wherein the first terminal is coupled to the second terminal of the scaling resistor and the second terminal of the first variable resistor is coupled to a ground node; and
a second variable resistor having a first terminal and a second terminal wherein the first terminal is coupled to the second terminal of the scaling resistor and the second terminal of the second variable resistor is coupled to the ground node.

6. The system of claim 5, wherein a value of the first variable resistor varies as a function of a function of a reference voltage range value, and a value of the second variable resistor varies as a function of a self-heating curvature correction magnitude value.

7. The system of claim 4, wherein the DAC is configured to output the calibration current based on the code and a self-heating curvature correction sign value.

8. The system of claim 1, wherein the nonlinear calibration circuit comprises:
a variable resistor; and
a fixed current source.

9. A multiplying digital-to-analog converter (MDAC) device, comprising:
a resistor ladder circuit comprising switches configured to be controlled by a code, and an output; and
a nonlinear calibration circuit comprising:
a calibration resistor having a first terminal coupled to the output of the resistor ladder circuit and with a second terminal coupled to an operational amplifier input; and
a calibration current source configured to provide a calibration current at the second terminal of the calibration resistor.

10. The MDAC device of claim 9, further comprising:
a reference voltage terminal configured to receive a reference voltage, wherein the reference voltage terminal is coupled to an input of the resistor ladder circuit;
a switch manager coupled to the resistor ladder circuit, wherein the switch manager is configured to provide control signals to switches of the resistor ladder circuit based on the code;
an operational amplifier having a first input, a second input and an output wherein the first input of the operational is coupled to the output of the resistor ladder circuit and the output of the operational amplifier.

11. The MDAC device of claim 9, wherein the calibration current source comprises:
a pre-scaling circuit having an output; and
a digital-to-analog converter (DAC) having an input coupled to the output of the pre-scaling circuit.

12. The MDAC device of claim 11, wherein the pre-scaling circuit comprises:
a scaling resistor having a first terminal and a second terminal;
a first variable resistor having a first terminal and a second terminal wherein the first terminal is coupled to the second terminal of the scaling resistor and the second terminal of the first variable resistor is coupled to a ground node; and
a second variable resistor having a first terminal and a second terminal wherein the first terminal is coupled to the second terminal of the scaling resistor and the second terminal of the second variable resistor is coupled to the ground node.

13. The MDAC device of claim 12, wherein a value of the first variable resistor varies as a function of self-heating curvature correction magnitude value, and a value of the second variable resistor varies as a function of a reference voltage range value.

14. The MDAC device of claim 13, wherein the DAC is configured to output the calibration current based on the code and a self-heating curvature correction sign value.

15. The MDAC device of claim 9, wherein the nonlinear calibration circuit is configured to apply a $2^{nd}$ order nonlinearity correction to cancel self-heating nonlinearity of the MDAC.

16. A method, comprising:
receiving, by a multiplying digital-to-analog converter (MDAC), a reference voltage and a multi-bit code;
providing a calibration current based on the multi-bit code and self-heating correction parameters of a calibration current circuit; and
adjusting an output current of the calibration current circuit nonlinearly based on the calibration current.

17. The method of claim 16, wherein providing the calibration current comprises receiving, by the calibration current circuit, the self-heating correction parameters, wherein the self-heating correction parameters comprise a self-heating curvature correction magnitude value and a self-heating curvature correction sign value.

18. The method of claim 17, further comprising testing the MDAC to determine the self-heating curvature correction magnitude value and the self-heating curvature correction sign value.

19. The method of claim 17, wherein providing the calibration current comprises:
  scaling a reference voltage based on a scaling resistor, the self-heating curvature correction magnitude value, and a voltage reference range value; and
  converting the scaled reference voltage to the calibration current based on the multi-bit code and the self-heating curvature correction sign value.

20. The method of claim 17, wherein providing the calibration current based on the multi-bit code and self-heating correction parameters of the MDAC involves a variable resistor and a fixed current source.

\* \* \* \* \*